(12) United States Patent
Wu et al.

(10) Patent No.: US 7,638,864 B2
(45) Date of Patent: Dec. 29, 2009

(54) CHIP PACKAGE, METHOD OF MAKING SAME AND DIGITAL CAMERA MODULE USING THE PACKAGE

(75) Inventors: Ying-Cheng Wu, Taipei Hsien (TW); Chun-Hung Lin, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 205 days.

(21) Appl. No.: 11/695,441

(22) Filed: Apr. 2, 2007

(65) Prior Publication Data

US 2008/0099864 A1 May 1, 2008

(30) Foreign Application Priority Data

Oct. 25, 2006  (CN) .................... 2006 1 0063294

(51) Int. Cl.
*H01L 23/02* (2006.01)
(52) U.S. Cl. ............... 257/678; 257/680; 257/773; 257/783; 257/784; 257/E23.013; 257/98; 257/99; 257/100; 438/106; 438/107; 438/25; 438/26; 438/27
(58) Field of Classification Search ......... 257/678–733, 257/783, E23.001–E23.194; 438/15, 25–28, 438/51, 55, 64–68, 106–127, FOR. 340–FOR. 384
See application file for complete search history.

(56) References Cited

U.S. PATENT DOCUMENTS

| 5,865,935 | A | 2/1999 | Ozimek et al. |
| 6,388,340 | B2 * | 5/2002 | Distefano .................... 257/787 |
| 7,453,509 | B2 * | 11/2008 | Losehand et al. ........... 348/340 |
| 2006/0093352 | A1 | 5/2006 | Webster et al. |

FOREIGN PATENT DOCUMENTS

JP  2-105443  *  4/1990  ................. 257/678

* cited by examiner

*Primary Examiner*—Jasmine J Clark
(74) *Attorney, Agent, or Firm*—Wei Te Chung

(57) ABSTRACT

A digital camera module (100) includes a chip package (110) and a lens module (130), mounted on the chip package, for forming a focused image on the chip package. The chip package includes a supporter (112), a chip (114), a plurality of wires (116), a main adhesive (118), and a cover plate (119). The supporter includes a through hole defined therethrough and has a plurality of top contacts (1130) formed thereon around the through hole. The chip is disposed in the through hole and includes a plurality of pads (1144) arranged thereon. The wires electrically connect the pads to the top contacts. The main adhesive is applied to a gap between the chip and the supporter and fixes the chip to the supporter. The cover plate is adhered and supported on the main adhesive. A method for making the chip package is also provided.

16 Claims, 11 Drawing Sheets

CHIP PACKAGE, METHOD OF MAKING SAME AND DIGITAL CAMERA MODULE USING THE PACKAGE

CROSS-REFERENCE TO RELATED APPLICATIONS

This application is related to a co-pending U.S. patent application Ser. No. 11/617,627, entitled "IMAGE SENSOR PACKAGE AND IMAGE SENSING MODULE USING THE PACKAGE", by Ying-Cheng Wu et al, recently filed with the same assignee as the present application. The above-identified application is incorporated herein by reference.

BACKGROUND

1. Technical Field

The present invention relates to chip packages, methods of making the chip packages, and digital camera modules using the package and, particularly, to a miniaturized chip package, a method of making the miniaturized chip package, and a digital camera module using the miniaturized chip package.

2. Description of the Related Art

With the ongoing development of microcircuitry and multimedia technologies, digital cameras are now in widespread use. High-end portable electronic devices, such as mobile phones and personal digital assistants (PDAs), are being developed to be increasingly multi-functional. Many of these portable electronic devices are now equipped with a digital camera module. The drive is to produce portable electronic devices that are increasingly smaller to satisfy the demand for portablility. Accordingly, the digital camera modules integrated in the portable electronic devices should have a compact volume to achieve the purpose of miniaturizing the portable electronic devices.

In a digital camera module, a chip package is a very important component in determining the volume of the digital camera module and quality of the pictures captured by the digital camera module. Referring to FIG. 1, a widely used, typical image sensor chip package 100a includes a carrier 10, an image sensor chip 20, a plurality of wires 23, a first adhesive 30, a second adhesive 40, and a cover 50.

The carrier 10 includes a base plate 11 and a sidewall 12 upwardly extending from a peripheral portion of the base plate 11. The base plate 11 and the sidewall 12 cooperatively define a receiving cavity 13 therebetween. The carrier 11 also includes a plurality of top contacts 14, arranged on a top surface of the base plate 10 and contained in the receiving cavity 13, and a plurality of bottom contacts 16, formed on a bottom surface of the base plate 11. Each top contact 14 is electrically connected to a corresponding bottom contact 16 via a respective conductor member 15 formed integrally with the base plate 11.

The image sensor chip 20 is received in the receiving cavity 13 and is secured on the base plate 11 via the first adhesive 30. A sensing portion 21 is formed on a surface of the image sensor 20. A plurality of pads 22 are formed around the sensing portion 21, and the pads 22 are connected to the contacts 14 via the wires 23.

The first adhesive 30 is applied to the top surface of the base plate 11, around the chip 20, and covers the pads 22, the wires 23, and the contacts 14.

The cover 50 is mounted on a top of the sidewall 12, via the second adhesive 40, to enclose the chip 20 in the receiving cavity 13.

In the image sensor chip package 100a, the top surface of the base plate 11, peripherally surrounded by the sidewall 12, must contain the top contacts 14 and the chip 20 together. Further, sufficient space should be provided between the chip 20 and an inside surface of the sidewall 12 for movement of wire bonding tools used to connect the wires 23 with the pads 22 and the top contacts 14. Therefore, package volume for packaging the chip 12 is a lot larger than that taken up by the chip 20, which results in a relatively larger volume of the image sensor chip package 100a. As such, the chip package 100 is not optimally suited for slim, compact electronic products.

SUMMARY

In one aspect, a chip package includes a supporter, a chip, a plurality of wires, a main adhesive, and a cover plate. The supporter includes a through hole defined therethrough and a plurality of top contacts formed thereon around the through hole. The chip is disposed in the through hole and includes a plurality of conductive pads arranged thereon. The wires electrically connect the pads to the top contacts. The main adhesive is applied to a gap between the chip and the supporter and fixes the chip to the supporter. The cover plate is adhered to and supported on the main adhesive.

In another aspect, a method of making the chip package includes the following steps:

a) providing a temporary sheet/substrate with, advantageously, a planar adhesive surface;

b) placing a chip onto the planar surface, wherein the chip has a top surface with a plurality of pads thereon, the top surface being arranged so as to face opposite the planar surface of the sheet;

c) placing a supporter with a through hole defined therein onto the planar surface and being positioned such that the chip is received in the through hole, the supporter having a plurality of top conducts formed thereon;

d) electrically connecting each respective pad with a corresponding top contact via a respective wire;

e) applying a main adhesive to a gap between the chip and the supporter, the main adhesive extending above the pads on the top surface of the chip;

f) placing a cover plate onto the main adhesive;

g) curing the main adhesive; and h) removing the sheet.

In another aspect, a digital camera module includes a chip package and a lens module mounted on the chip package and configured (i.e., structured and arranged) for forming a focused image on the chip package. The chip package includes a supporter, a chip, a plurality of wires, a main adhesive, and a cover plate. The supporter includes a through hole defined therethrough, and a plurality of top contacts formed thereon around the through hole. The chip is disposed in the through hole and includes a plurality of pads arranged thereon. The wires electrically connect the pads to the top contacts. The main adhesive is applied to a gap between the chip and the supporter and fixes the chip to the supporter. The cover plate is adhered to and is supported on the main adhesive.

Other advantages and novel features will become more apparent from the following detailed description when taken in conjunction with the accompanying drawings.

BRIEF DESCRIPTION OF THE DRAWINGS

Many aspects of the present chip package, method of making same, and digital camera module using the package can be better understood with reference to the following drawings. The components in the drawings are not necessarily drawn to scale, the emphasis instead being placed upon clearly illustrating the principles of the chip package, method of making same, and digital camera module using the package. Moreover, in the drawings, like reference numerals designate corresponding parts throughout the several views.

DETAILED DESCRIPTION OF THE PREFERRED EMBODIMENTS

Figure 1:
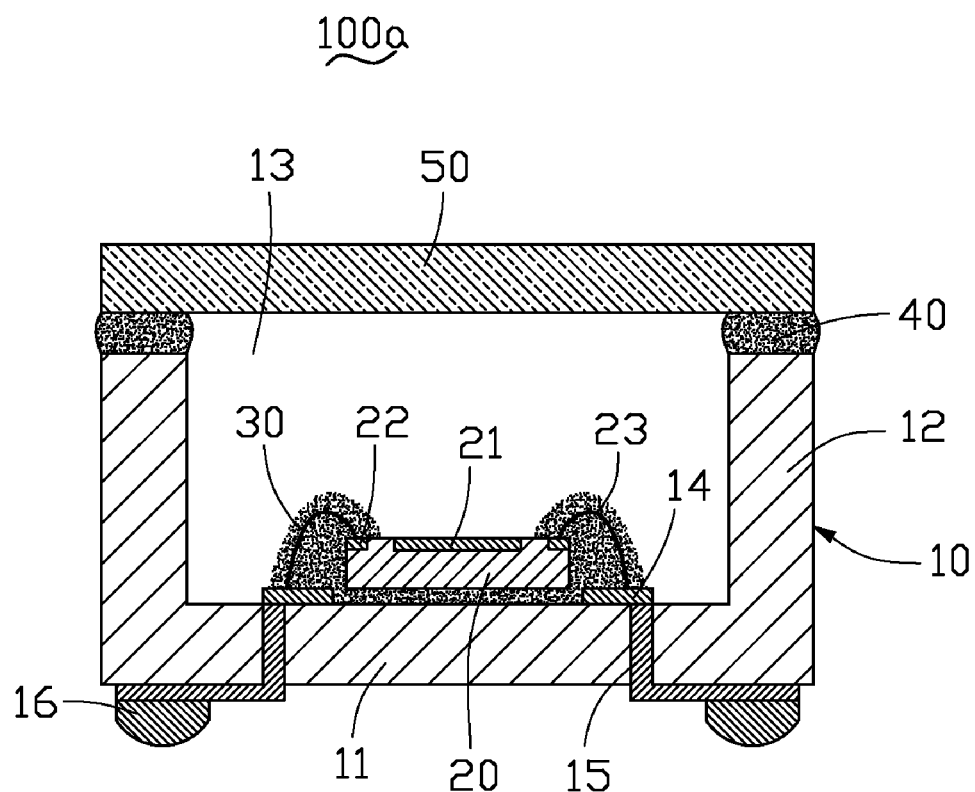
FIG. 1 is a schematic, cross-sectional view of a typical chip package.
Figure 2:
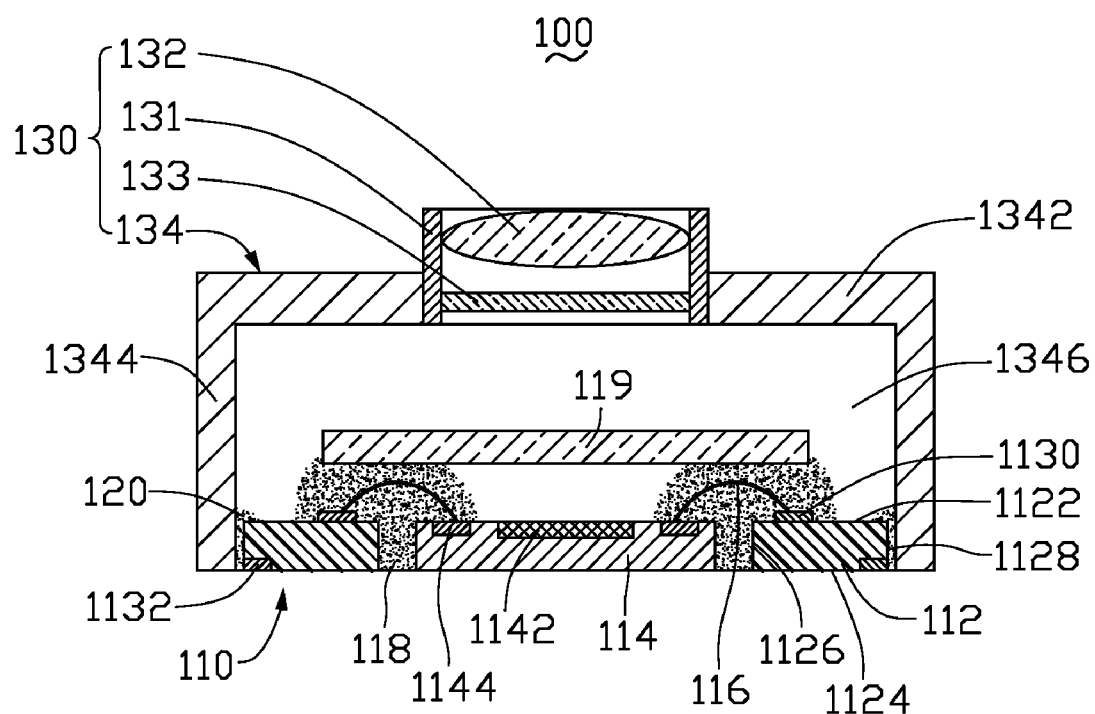
FIG. 2 is a schematic, cross-sectional view of a digital camera module, in accordance with a first preferred embodiment.

Referring now to the drawings in detail, FIG. 2 shows a digital camera module 100, in accordance with a first preferred embodiment. The digital camera module 100 includes a chip package 110, a subsidiary adhesive 120, and a lens module 130. The lens module 130 is mounted to the chip package 110 via the subsidiary adhesive 120 and is configured to form a focused object image on the chip package 110.

The chip package 110 includes a supporter 112, a chip 114, a plurality of wires 116, a main adhesive 118, and a cover plate 119.

The supporter 112 is frame shaped and includes a top surface 1122, a bottom surface 1124, a through hole (not labeled), an inside surface 1126, and an outside surface 1128. The bottom surface 1124 is positioned opposite to the top surface 1122, and the through hole is defined in the interior of the supporter 112 penetrates through the top surface 1122 and the bottom surface 1124. The inside surface 1126 within the supporter 112, in fact, serves as the boundary of the through hole.

A plurality of top conductive contacts 1130 are arranged on the top surface 1122 and are positioned at locations around/proximate the through hole. A plurality of bottom conductive contacts 1132 are formed on the bottom surface 1124, along an outer perimeter of the bottom surface 1124. Each top contact 1130 electrically connects with a corresponding bottom contact 1132 via a respective interconnecting device (not shown). The top and bottom contacts 1130, 1132 are both configured for electrically connecting with other electronic components. For example, the top contacts 1130 can be used to electrically connect to a chip and the bottom contacts 1132 can be used to electrically connect with a printed circuit board (PCB), thereby transmitting signals from the chip to the PCB via the interconnecting device. The interconnecting device can be plated through holes or conductive leads.

The chip 114 can be, for example, a complementary metal-oxide-semiconductor transistor (CMOS) image sensor or a charge coupled device (CCD) image sensor. A top surface of the chip 114 includes an active area 1142 (e.g., a photo-registering zone) and a number of pads 1144 arranged around the active area 1142. The pads 1144 are configured for electrically connecting with other electronic components to transmit electrical signals from the chip 114 to other electronic components. The chip 114 is disposed in the through hole of the supporter 112, with the top surface of the chip 114 being essentially co-planar with the top surface 1122 of the supporter 112. Furthermore, the outside surface of the chip 114 and the inside surface 1126 of the supporter 112 together define a gap therebetween.

The wires 116 electrically respectively connect the top contacts 1130 of the supporter 112 to the corresponding pads 1144 of the chip 114, and each wire 116 forms a corresponding wire loop.

The main adhesive 118 is advantageously somewhat viscous yet reasonably still flowing when initially applied (i.e., fairly easy to apply but generally retains its shape and position upon application) and then readily hardenable, e.g., by self-curing, heating, or application of ultraviolet light. The main adhesive 118 is configured to fix the chip 114 to the supporter 112 and to hold/space the cover plate 119 above each wire loop formed by the wires 116 (i.e., the main adhesive 118 functions as both an adherent and a spacer). In particular, the main adhesive 118 is applied in the gap between the chip 114 and the supporter 112 and to an outer periphery of the top surface of the chip 114, surrounding the active area 1142 of the chip 114, and to an inner periphery of the top surface of the supporter 112. The portion of the main adhesive 118 in the gap fills the space between the chip 114 and the supporter 112, contacting both such elements. The main adhesive 118 thereby fixes the chip 114 to the supporter 112 when the main adhesive 118 is hardened. The main adhesive 118 additionally covers the pads 1144, the wires 116, and the top contacts 1130. As such, the main adhesive 118 protects the pads 1144, the wires 116, and the top contacts 1130 from damage by external force and maintains suitable spacing between such elements and the cover plate 119.

The cover plate 119 is stacked above the top surface of the chip 114 and is adhered/attached to the main adhesive 118, permanently mounting the cover plate 119 relative to the chip 114. The cover plate 119 and the main adhesive 118 cooperatively close the active area 1142 of the chip 114, protecting the active area 1142 from pollution/contamination and/or other external environmental effects (e.g., temperature extremes, humidity, etc.). The cover plate 119 is advantageously transparent (e.g., composed of an optical glass or plastic), thus permitting light to pass therethrough to the active area 1142 of the chip 114.

The subsidiary adhesive 120 is applied to the outside surface 1128 of the supporter 112 and thereby fixes the lens module 130 to the chip package 110.

The lens module 130 includes a barrel 131, at least one lens 132, a filter 133, and a holder 134. The barrel 131 is a hollow cylinder in shape. The at least one lens 132 and the filter 133 are mounted in the barrel 131. The holder 134 includes a top board 1342 and a pedestal 1344 downwardly extending from a peripheral portion of the top board 1342. The top board 1342 has a through hole defined in a middle portion thereof. The top board 1342 and the pedestal 1344 cooperatively define a receiving space 1346 therebetween. An inner periphery of the pedestal 1344 has a dimension slightly larger than that of the outside surface of the supporter 112. The barrel 131 is received in the through hole of the holder 134, and it should be preferred that the barrel 131 is threadably engaged with the holder 134, in a manner such that the position of the barrel 131 can be adjusted. It is to be understood, however, that an alternative position adjustment means could be provided in lieu of a thread engagement, and such means would be considered within the scope of the lens module 130.

The pedestal 1344 is adhered to the supporter 112 of the chip package 110 via the subsidiary adhesive 120. The pedestal 1344 receives the chip package 110 in the receiving space 1346 of the holder 134. Jointly, the at least one lens 132 received in the barrel 131 is placed over the active area 1142 of the chip 114 to form a focused image on the active area 1142.

In the first preferred embodiment, the supporter 112 can have a thickness approaching the thickness of the chip 114, thereby reducing the height of the chip package 110. In addition, the pads 1144 of the chip 114 and the top contacts 1130 of the supporter 112 are arranged almost on a level (i.e., essentially co-planar). Thus, movement of the wire bonding tool is made easier, so the dimensions of the supporter 112 also can approach that of the chip 114 (i.e., the need for a gap therebetween is reduced). Therefore, the chip package 114 can have a relative small volume. Moreover, the main adhesive 118 and the cover plate 119 cooperatively form a relatively small sealing space to seal the active area 1142 of the chip 114, and a relatively small sealing space offers a lowered opportunity for containment of less dust and water vapor therein. Therefore, the potential for pollution of the active area 1142 of the chip 114 is reduced, and quality of the digital camera module 100 is much improved.

Figure 3:
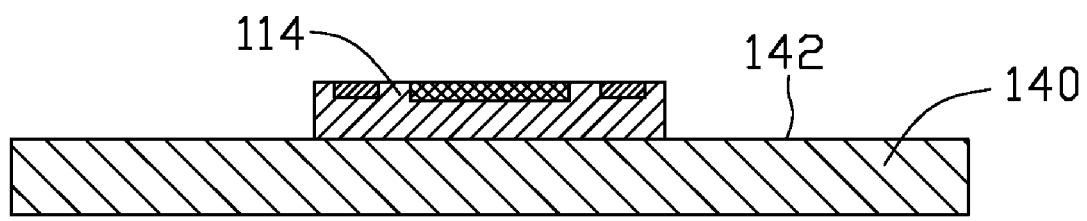
FIG. 3 through FIG. 7 illustrate various sequential stages in making the digital camera module of FIG. 2.
Figure 4:
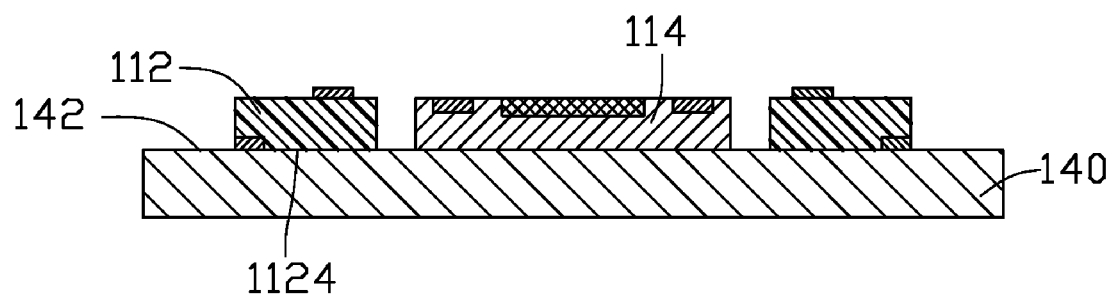
Figure 5:
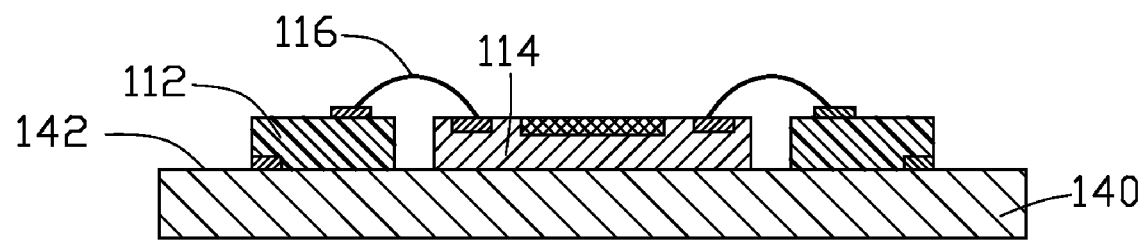
Figure 6:
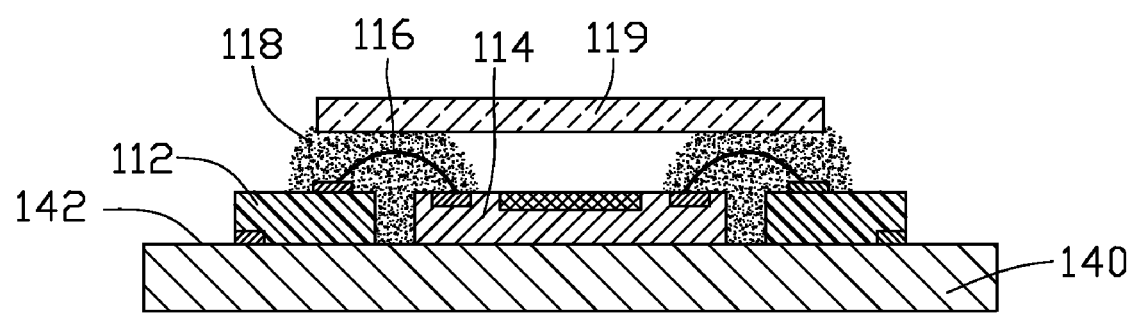

Referring to FIGS. 2-6, a method of making the chip package 110 includes the following steps:

providing a temporary sheet/substrate 140 with a planar surface 142, which is advantageously a planar adhesive surface (e.g., as provided if the temporary sheet 140 were an adhesive tape);

placing a chip 114 (as is shown in FIG. 3) onto the planar surface 142 to temporarily adhere the chip 114 to the temporary sheet 140, wherein the chip 114 has a top surface including an active area 1142 and a plurality of pads 1144;

placing a supporter 112 (as is shown in FIG. 4) onto the planar surface 142 to temporarily adhere the supporter 112 to the temporary sheet 140, the supporter 112 having a through hole defined therein with the chip 114 being received in the through hole, the supporter 112 having a plurality of top conducts 1130 formed on a top surface 1122 thereof and a plurality of bottom contacts 1132 formed on a bottom surface 1124 thereof;

electrically connecting each respective pad 1144 (as is shown in FIG. 5) with a corresponding top contacts 1130 via a respective wire 116;

applying a main adhesive 118 (as is shown in FIG. 6) to a gap between the chip 114 and the supporter 112 in a manner such that the main adhesive 118 is filled in the gap, the main adhesive 118 further covering an outer periphery of the top surface of the chip 112, the wires 116, and an inner periphery of the top surface 1122 of the supporter 112;

placing a transparent cover plate 119 onto the main adhesive 118;

curing the main adhesive 118; and removing the temporary sheet 140 to release the supporter 112 and the chip 114 therefrom, thereby forming the chip package 110.

Figure 7:
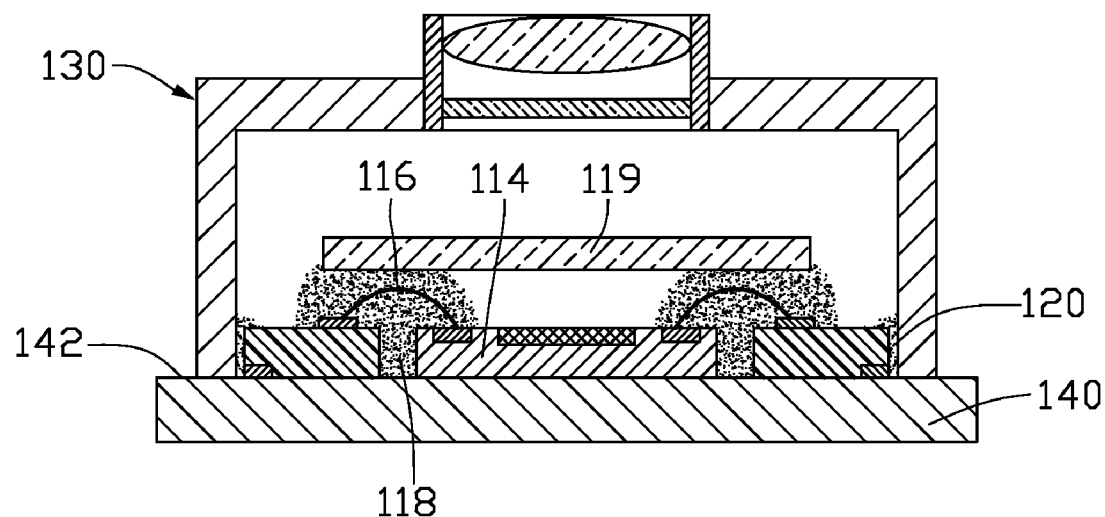

In assembly of the digital camera module 100, the lens module 130 can be mounted to the chip package 100 either before the step of removing the temporary sheet 140 or after the step of removing the temporary sheet 140. As shown in FIG. 7, the lens module 130 is mounted to the chip package 100 before the step of removing the temporary sheet 140. Under this status/situation, the lens module 130 is assembled according to the following steps:

applying a subsidiary adhesive 120 to the planar surface 142, around the outside surface 1128 of the supporter 112;

providing a lens module 130, the lens module 130 including a barrel 131, at least one lens 132, a filter 133 attached to the barrel 131, and a holder 134 receiving the barrel 131, the holder 134 having a top board 1342 and a pedestal 1344, the top board 1342 and the pedestal 1344 cooperatively defining a receiving space 1346 therebetween;

mounting the holder 134 of the lens module 130 to the chip package 110, with an inner periphery of the pedestal 1344 being fixed to the outside surface 1128 of the supporter 112 via the subsidiary adhesive 120, the at least one lens 132 being operatively directed towards to the active area 142 of the chip; and removing the temporary sheet 140 to release the chip package 110 therefrom.

Figure 8:
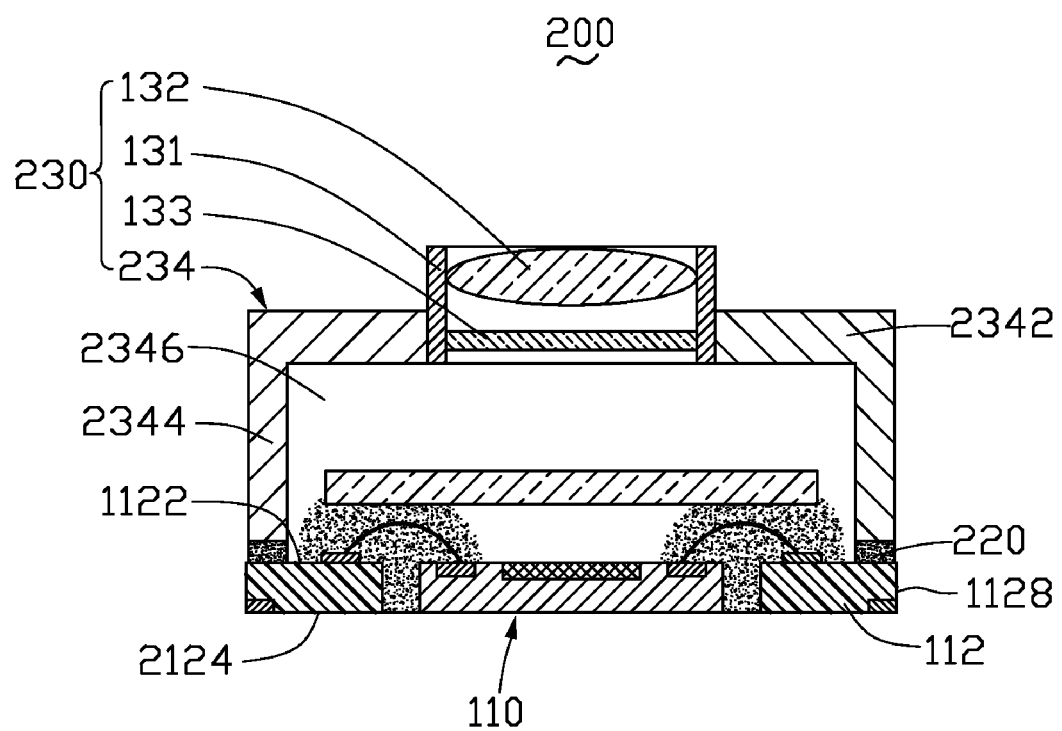
FIG. 8 is a schematic, cross-sectional view of a digital camera module, in accordance with a second preferred embodiment.

Referring to FIG. 8, a digital camera module 200, in accordance with a second preferred embodiment, is illustrated. The digital camera module 200 has a similar structure to the digital camera module 100 and includes a chip package 110, a subsidiary adhesive 220, and a lens module 230. The lens module includes a barrel 131, at least one lens 132, a filter 133, and a holder 234. The digital camera module 200 differs from the digital camera module 100 primarily in size and in the mounting of the holder 234.

The holder 234 includes a top board 2342 and a pedestal 2344. The pedestal 2344 has an outer periphery, which has an outer dimension approximately equal to that of the outside surface 1128 of the supporter 112. Thus, the holder 234 of the lens module 230 is relative smaller in size than that of the holder 134 of the lens module 130.

In assembly, the subsidiary adhesive 220 is applied to a peripheral portion of the top surface 1122 of the supporter 112. The pedestal 2344 of the holder 234 is fixed to the top surface of the supporter 112 via the subsidiary adhesive 220 (i.e., not surrounding the supporter 112, as the case in the first embodiment).

Understandably, the volume of the holder 234 of the lens module 230 is further reduced, thereby reducing the volume of the digital camera module 200 relative to that of the digital camera module 100.

Figure 9:
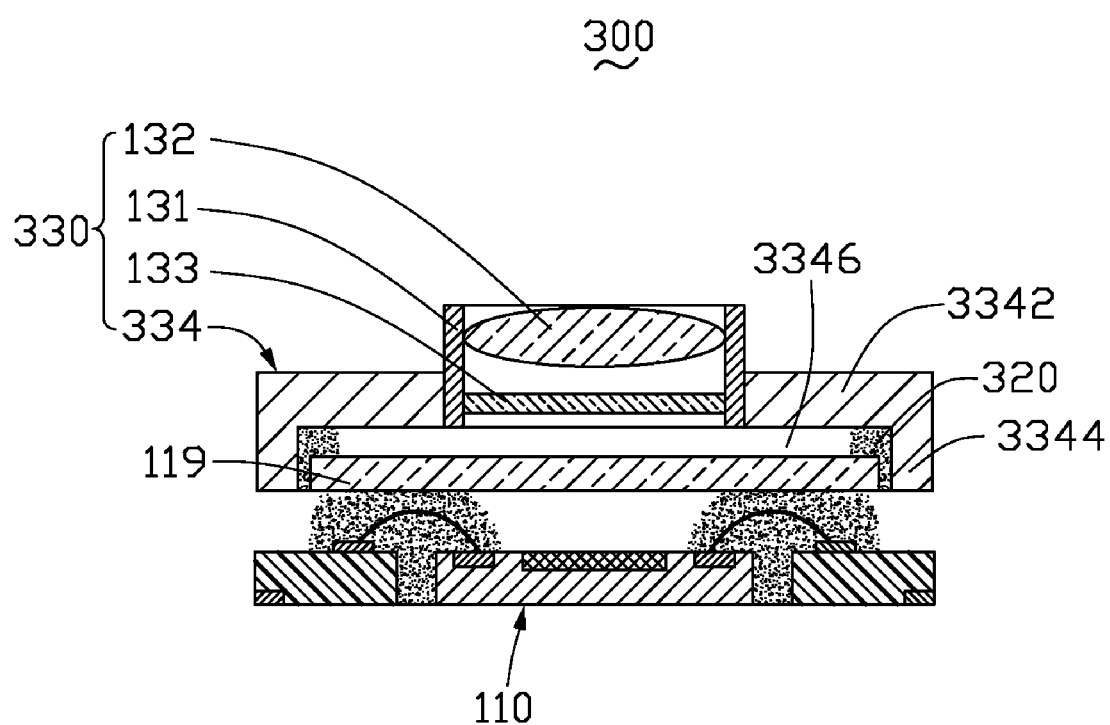
FIG. 9 is a schematic, cross-sectional view of a digital camera module, in accordance with a third preferred embodiment.

Referring to FIG. 9, a digital camera module 300, in accordance with a third preferred embodiment, is illustrated. The digital camera module 300 has a similar structure to the digital camera module 100 and includes a chip package 110, a subsidiary adhesive 320, and a lens module 330. The lens module includes a barrel 131, at least one lens 132, a filter 133 and a holder 334. The digital camera module 200 differs from the digital camera module 100 primarily in size and the manner/way of mounting of the holder 334.

The holder 334 includes a top board 3342 and a pedestal 3344. The pedestal 3344 advantageously has an inner periphery, which has interior dimensions approximately equal to those of an outside surface of the cover plate 119, and has a height approximately equal to the thickness of the cover plate 119. As such, a receiving space 3346 is formed therein, which can appropriately receive therein the cover plate 119. Thus, the holder 334 of the lens module 330 is relatively smaller in size than that of the holder 134 of the lens module 130 and the holder 234 of the lens module 230.

In assembly, the subsidiary adhesive 320 is applied onto a peripheral portion of a top surface of the cover plate 119. An inner surface of the top board 3342 of the holder 334 and the inner periphery of the pedestal 3344 are attached to the cover plate 119 via the subsidiary adhesive 320.

Understandably, the volume of the holder 334 of the lens module 330 is further reduced over the holder 234 of the lens module 230. In this way, volume and weight of the digital camera module 300 can also be further reduced.

Figure 10:
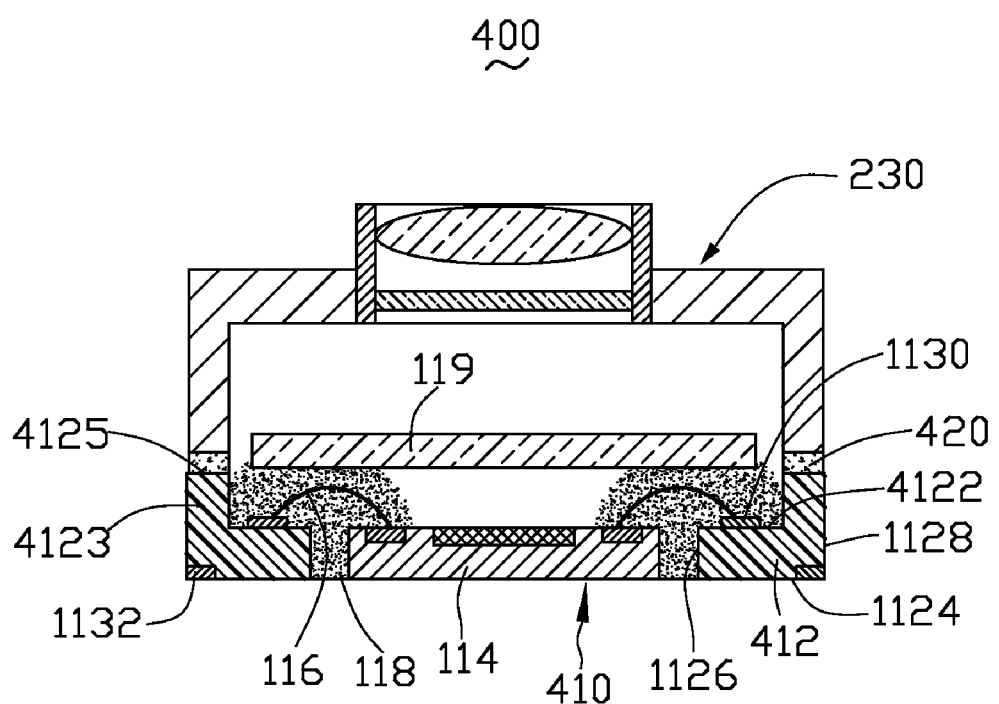
FIG. 10 is a schematic, cross-sectional view of a digital camera module, in accordance with a fourth preferred embodiment.

Referring to FIG. 10, a digital camera module 400, in accordance with a fourth preferred embodiment of the present invention, is provided. Similarly to the digital camera module 200, the digital camera module 400 includes a chip package 410, a subsidiary adhesive 420, and a lens module 230. The chip package 410 includes a supporter 412, a chip 114, a main adhesive 118, a plurality of wires 116, and a cover plate 119. These components of the digital camera module 400 are similar to their corresponding components of the digital camera module 100. The digital camera module 400 differs from the digital camera module 200 primarily in the structure of the supporter 412.

The supporter 412 includes a top surface 4122, a bottom surface 1124, an inside surface 1126, an outside surface 1128, a plurality of top contacts 1130, and a plurality of bottom contacts 1132. The supporter 412 further includes a frame portion 4123 extending upwardly from an outer peripheral portion of the top surface 4122. The frame portion 4123 surrounds the top contacts 1130 and has an end surface 4125.

In assembly, the subsidiary adhesive 420 is applied onto the end surface 4125 of the supporter 412. The lens module 230 is disposed on the chip package 410 and is adhered thereto via the subsidiary adhesive 420.

In the fourth embodiment, it is advantageous that the frame portion 4123 is provided to prevent the main adhesive 118 from flowing along the outside surface 1128 of the supporter 412. Therefore, the bottom contacts 1132 have only a minimal risk of being polluted/contaminated by the main adhesive 118.

Figure 11:
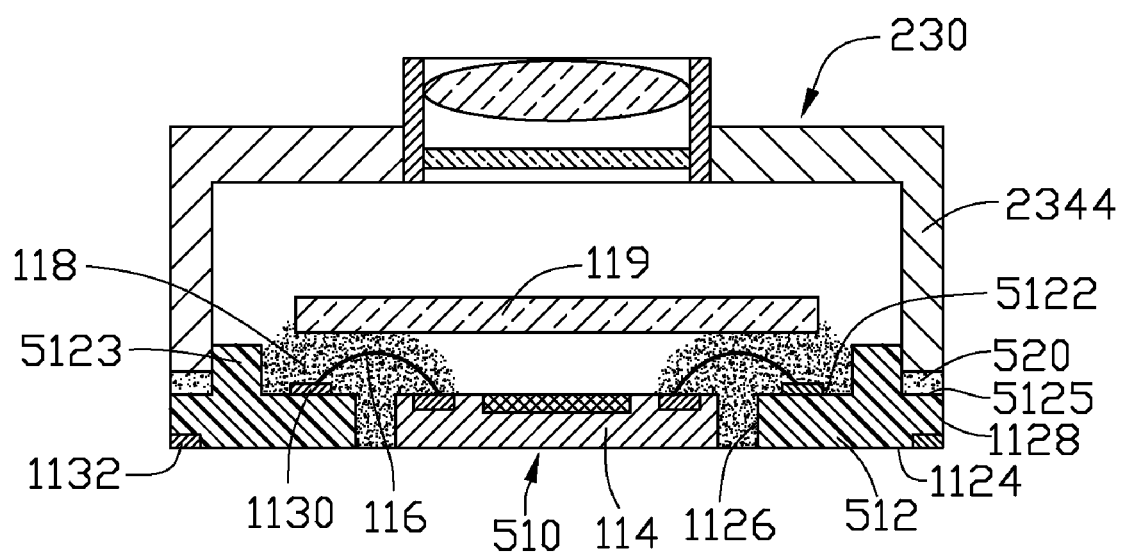
FIG. 11 is a schematic, cross-sectional view of a digital camera module, in accordance with a fifth preferred embodiment.

FIG. 11 shows a digital camera module 500, in accordance with a fifth preferred embodiment. Similarly to the digital camera module 400, the digital camera module 500 includes a chip package 510, a subsidiary adhesive 520, and a lens module 230. The chip package 510 has a supporter 512, a chip 114, a plurality of wires 116, a main adhesive 118, and a cover plate 119. The digital camera module 500 differs from the digital camera module 100 mainly in the structure of the supporter 512.

The supporter 512 includes a top surface 5122, a bottom surface 1124, an inside surface 1126, an outside surface 1128, a plurality of top contacts 1130, and a plurality of bottom contacts 1132. The supporter 512 further includes a frame portion 5123 extending upwardly from the top surface 5122. The frame portion 5123 is spaced at a distance from the outside surface 1126 and surrounds the top contacts 1130, thus forming a mounting surface 5125 at a peripheral portion of the top surface 5122. An outer periphery of the frame portion 5123 has an outer profile approximately equal to that of an inner periphery of the pedestal 2344 of the holder 234.

In assembly, the subsidiary adhesive 520 is applied onto (e.g., advantageously, directly thereto) the mounting surface 5125 of the supporter 512. The lens module 230 is disposed on the chip package 510 and is adhered thereto via the subsidiary adhesive 520, with the inner periphery of the pedestal 2344 advantageously directly abutting against the outer periphery of the frame portion 5123.

In the fifth embodiment, the frame portion 5123 is used to prevent the main adhesive 118 from flowing along the outside surface 1128 of the supporter 512 and is helpful for positioning the lens module 230 onto the chip package 510. Therefore, the bottom contacts 1132 have minimal risk of being polluted/contaminated by the main adhesive 118, and the lens module 230 has minimal risk of being displaced.

It is to be understood, however, that even though numerous characteristics and advantages of the present invention have been set forth in the foregoing description, together with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A chip package, comprising:
   a supporter having a through hole defined therethrough and having a plurality of top contacts formed thereon around the through hole;
   a chip disposed in the through hole, the chip having a plurality of pads arranged thereon;
   a plurality of wires respectively electrically connecting the corresponding pads to the corresponding top contacts;
   a main adhesive applied to a gap between the chip and the supporter, the main adhesive fixing the chip to the supporter; and
   a cover plate supported on the main adhesive.

2. The chip package as claimed in claim 1, wherein the chip has an active area surrounded by the pads, the main adhesive is applied to the chip around the active area, and the cover plate and the main adhesive cooperatively enclose the active area.

3. The chip package as claimed in claim 2, wherein the main adhesive is configured to hold the cover above each wire.

4. The chip package as claimed in claim 3, wherein the supporter has a top surface on which the top contacts are arranged, the supporter further has a frame portion extending upwardly from an outer periphery of the top surface and surrounding the top contacts.

5. The chip package as claimed in claim 3, wherein the supporter has a top surface on which the top contacts are arranged, the supporter further has a frame portion extending upwardly from the top surface and surrounding the top contacts, and the frame portion is spaced at a distance from an outer periphery of the top surface.

6. A method of making a chip package, comprising the following steps:
   providing a temporary sheet with a planar surface;
   attaching a chip onto the planar surface of the temporary sheet, the chip having a top surface with a plurality of pads formed thereon;
   placing a supporter with a through hole defined therein onto the planar surface of the temporary sheet, the chip being received in the through hole of the supporter, the supporter having a plurality of top conducts formed thereon;
   electrically connecting each respective pad with a corresponding top contact via a respective wire;
   applying a main adhesive to a gap between the chip and the supporter;
   placing a cover plate onto the main adhesive;
   curing the main adhesive; and
   removing the temporary sheet.

7. A digital camera module, comprising:

a chip package comprising:

a supporter having a through hole defined therethrough and having a plurality of top contacts formed thereon around the through hole;

a chip disposed in the through hole, the chip having a plurality of pads arranged thereon;

a plurality of wires respectively electrically connecting the corresponding pads to the corresponding top contacts;

a main adhesive applied to a gap between the chip and the supporter, the main adhesive fixing the chip to the supporter; and a cover plate supported on the main adhesive; and a lens module mounted to the chip package to form a focused image on the chip.

8. The digital camera module as claimed in claim 7, wherein the chip has an active area surrounded by the pads, and the main adhesive is applied to the chip around the active area, and the cover plate and the main adhesive cooperatively enclose the active area.

9. The digital camera module as claimed in claim 8, wherein the main adhesive is configured to hold the cover above each wire loop formed by a respective wire.

10. The digital camera module as claimed in claim 8, wherein the lens module has a holder, and at least one lens is received in the holder and thereby configured to form a focused image on the chip.

11. The digital camera module as claimed in claim 10, wherein the lens holder comprises a top board and a pedestal protruding from an outer periphery of the top board, the pedestal has an end, and the end of the pedestal is mounted to the chip package.

12. The digital camera module as claimed in claim 11, wherein the pedestal of the lens holder is adhered to an outside surface of the supporter.

13. The digital camera module as claimed in claim 11, wherein the pedestal of the lens holder is adhered to the top surface of the supporter.

14. The digital camera module as claimed in claim 13, wherein the supporter has a top surface on which the top contacts are arranged, the supporter has a frame portion extending upwardly from an outer periphery of the top surface thereof and surrounding the top contacts, and the pedestal is mounted on a top of the frame portion.

15. The digital camera module as claimed in claim 13, wherein the supporter has a top surface on with the top contacts are arranged, the supporter has a frame portion extending upwardly from the top surface and surrounding the top contacts, and the frame portion is spaced at a distance from an outer periphery of the top surface and thereby forms a mounting surface at an outer periphery of the top surface, and the pedestal is mounted to the mounting surface with an inner periphery of the pedestal abutting against an outer periphery of the frame portion.

16. The digital camera module as claimed in claim 11, wherein the pedestal is mounted to the cover of the chip package.

* * * * *